Aug. 24, 1965 T. H. STEARNS 3,201,851

METHOD OF MAKING INTERCONNECTING MULTILAYER CIRCUITS

Filed Oct. 5, 1960 2 Sheets-Sheet 1

Thomas H. Stearns
INVENTOR
Robert O. Richardson
ATTORNEY

Aug. 24, 1965 T. H. STEARNS 3,201,851

METHOD OF MAKING INTERCONNECTING MULTILAYER CIRCUITS

Filed Oct. 5, 1960 2 Sheets-Sheet 2

INVENTOR
THOMAS H. STEARNS

By
[signature]

United States Patent Office 3,201,851
Patented Aug. 24, 1965

3,201,851

METHOD OF MAKING INTERCONNECTING MULTILAYER CIRCUITS

Thomas H. Stearns, Wilton, N.H., assignor to Sanders Associates, Inc., Nashua, N.H., a corporation of Delaware Filed Oct. 5, 1960, Ser. No. 60,650
5 Claims. (Cl. 29—155.5)

This invention relates to the method of making multilayer circuits wherein highly accurate dimensional control is necessary and to the method of interconnecting such circuits. Because of the difference in expansion characteristics of thermoplastic material and a sheet of copper foil to be bonded thereto, the composite sheet will curl or warp after lamination since bonding occurs before the composite has returned to room temperature. Then, with the removal of a relatively large quantity of the copper foil in the etching of a circuit, the stresses placed upon the composite by the copper are diminished and the stresses due to the thermoplastic material will again change the shape of the circuit and its dimensional limitations. As successive layers of foil and thermoplastic material are added, and the foil is etched into a desired circuit, the dimensional control of each of the circuits relative to the next layer becomes increasingly difficult. In addition, there is the problem of interconnecting the plurality of layers of circuits at discrete points after the laminations of the several layers have been completed.

The present invention has particular use in a requirement which calls for 260 groups of circuit configurations of 12 connections each, all located within a 12" x 12" area and in which no part of the article can vary over a plus or minus .005 inch distance. Three layers of superimposed circuits are required. This high degree of accuracy requires that each of the various circuits remain in position relative to the others so that the conductor terminal pads will be in a very accurate alignment for interconnection since the three circuits must be connected together in over 3100 places.

It is therefore an object of the present invention to provide for a new and improved method of laminating a plurality of layers of circuits together with a high degree of dimensional control.

Another object is the provision of a method of interconnecting a plurality of superimposed circuits, each encapsulated in thermoplastic insulating material.

Another object is the provision of a method of laminating sheets of copper foil to thermoplastic material, etching circuit paths therefrom and bonding several layers together with highly accurate dimensional control.

A further object is the provision of a method of connecting a plurality of flexible circuits bonded together.

Figure 1:
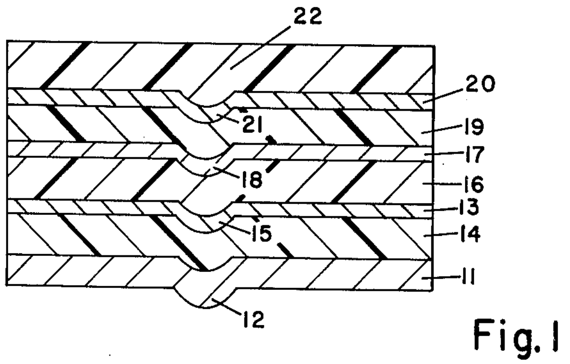
Figure 2:
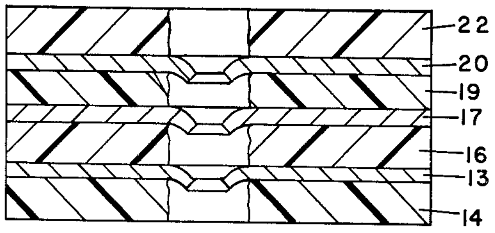
Figure 3:
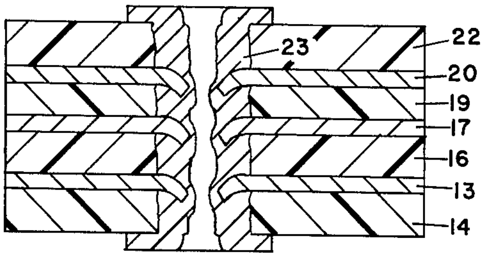
Figure 4:
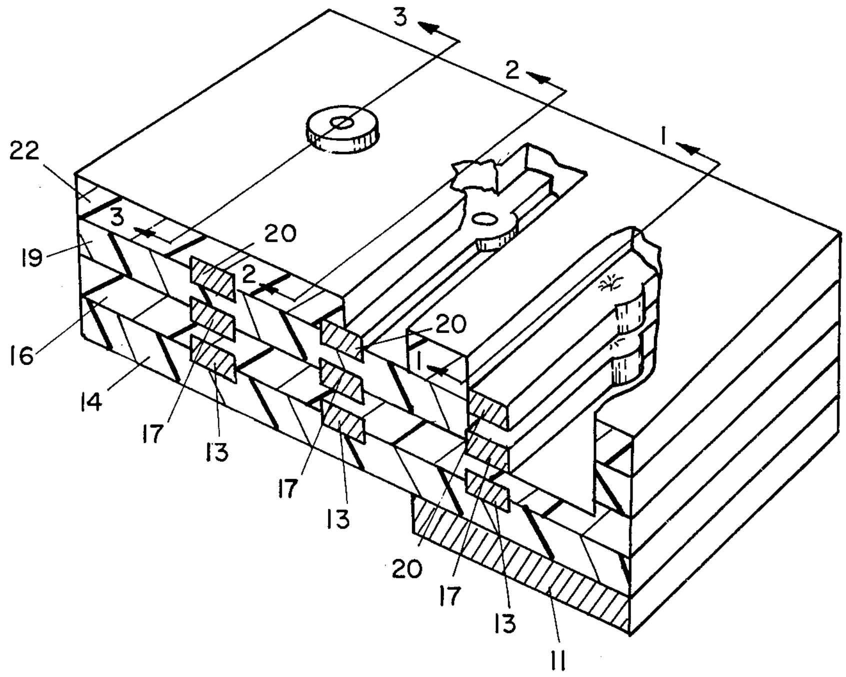

Other objects will become more apparent as a full and complete description of the invention is made, having reference to the drawings wherein:

FIGURE 1 is a cross-sectional view of several layers of conductors laminated in spaced relationship, taken along the line 1—1 in FIGURE 4, FIGURE 2 is a cross-sectional view of the connecting opening through which the layers of circuits will be connected, taken along the line 2—2 in FIGURE 4, FIGURE 3 is a cross-sectional view showing the interconnection between the several layers of circuits, taken along the line 3—3 in FIGURE 4, and FIGURE 4 is a perspective, with portions of the plastic removed to show the arrangement of conductors and holes therein.

In the fabrication of flexible circuits, a sheet of copper foil is laminated to a base of thermoplastic material and bonded thereto under suitable heat and pressure. Thereafter, the desired circuit is etched on the foil with unwanted portions removed and a top coating of the thermoplastic material is then applied. Again heat and pressure is used to thus encapsulate the circuit within a thermoplastic material. In the laminating process, the thermoplastic material becomes quite pliable and tends to flow under the pressure and heat applied thereto. This moves the copper conductors from their original positions, such that if they are closely spaced the conductors will come in contact with each other and cause shorts or even move to the surface where it is no longer encapsulated with an insulation material. The possibility of such errors in circuit fabrication is compounded as multiple layers of conductors are laminated together. Here maintaining vertical alignment between the several layers for interconnection poses another problem. One such solution to the conductor movement or swimming problem is the use of a copper dam, more fully disclosed in co-pending application, Serial No. 724,937, filed March 31, 1958, now Patent No. 2,964,436, wherein a portion of the copper foil not used in the circuit itself is retained and its presence tends to retard the outward movement of the conductors under vertical pressure. It has been found, however, that by increasing the ratio of copper to the amount of plastic used, there is less warpage due to the different rates of thermal expansion. Therefore, in the fabrication of the circuits in practicing this invention, instead of removing all unwanted portions of copper, the concept of the copper dam has been expanded such that all unwanted portions of copper not used as a circuit is retained, with an insulating cap etched in the foil to space the actual conductor from the unused copper retained. In this manner, a subsequent heating of the thermoplastic material will not cause the circuit to buckle or bend to such an extent as the material is cooled.

In addition to this, as shown in FIGURE 1, a heavy base plate 11 is used as the base for laminating the circuits. This base plate has provided therein a plurality of dimples 12 which designate where circuit interconnections are to be made. A first sheet of copper foil 13 is bonded to a base 14 of the thermoplastic material which at the same time is bonded to the base copper plate 11. After the desired circuit has been etched from the copper foil 13, suitable depressions 15 are made in alignment with the dimples 12 to designate where circuit interconnections are to be made later. The next layer of thermoplastic material 16 simultaneously provides a cover for the conductor 13 and a base for the next superimposed copper foil 17. Because of the etching of material from the conductor 13, the base 11 is necessary to provide a stabilizing influence upon the thermoplastic material in its fluid or pliant condition in lamination and the recessed portion 15 further prevents undue lateral motion of the thermoplastic material 16. After etching the circuit on foil 17 and providing the necessary recessed portions 18 therein, another layer of thermoplastic material 19 and its associated copper foil 20 are next applied. The void created by the recessed portion 18 becomes filled with thermoplastic material, such as to provide stability against lateral movement of the material when it cools. After the subsequent circuit etching of foil 20 and its recessing at 21, a final layer of the thermoplastic material 22 is then applied.

While the buildup of successive layers as above described is the preferred method, it is also feasible to independently and individually laminate the base portions with their associated conductors thereon, and then successively tacking each layer upon the other in correct dimensional alignment. However, following this embodiment, a plurality of bases such as 11 would have to be used, and then removed by an etching process, before the circuits can be stacked and laminated together. In the lamination of each circuit individually with its associated base, a suitable cover coat may be applied over each of the circuits before lamination to the next succeeding base. This generally presents no problems except that in certain types of thermoplastic material, a suitable binder or bonding material must be used between layers of thermoplastic material that has already been subjected to heat and pressure before suitable bonding may be accomplished.

Having assembled the various circuits to be in absolute alignment in each of the 3120 locations in a 12 inch square pattern, the next problem is to effectively and inexpensively interconnect the layers of circuits. This is accomplished first by drilling holes at the points of interconnection as designated by the depressions in the circuits such as at 15, 18, and 21 in FIGURE 1. It has been found that by fast drilling with a very dull drill, enough heat is generated to melt the plastic around the hole. The plastic is thus peeled or stripped back from the conductors, such that these conductors are exposed over a larger area for interconnection. This exposed conductive surface has been further enlarged by the dimpling effect previously made therein. Although the temperature required will vary according to the type of thermoplastic material used, it has been found that 200 degrees centrigrade is quite readily generated with a dull high-speed drill, and that this temperature is sufficient for melting the material used as insulation.

The holes are next sensitized with a suitable current conducting material by dipping, painting, or spraying in a conventional manner, such that electroplating through the holes may be accomplished. Because the sensitizing and electroplating procedures are so thoroughly familiar to those skilled in the art, it is not thought that detailed steps need be further described, it being sufficient to point out that to provide electroplating from one outer surface of the multilayer structure to the other, suitable connections must be made on the outer surfaces, whereas plating to interconnect the three circuits without plating to the outer surface, suitable connections will be made through the outer-most layers of circuits. The thickness of the plating will depend upon the original size of the hole and the size of the hole desired.

Having thus described the preferred embodiment of this invention, it is believed that the ability to make three layers of circuitry in absolute alignment at over 3100 discrete points in a 12 inch square with a plus or minus variation of .005 inch and to conveniently and inexpensively make interconnections between these circuits at these points has resulted from the utilization of a heavy copper base plate upon which the first thermoplastic insulating base material is bonded throughout the subsequent laminations, the making of depressions in the circuit material at points to be aligned, the utilization of a maximum ratio of copper foil to thermoplastic base, the unique method of drilling the holes and the electroplating of the multiple circuits having terminations within the hole, all of which are unique in the present invention, each individually and in combination to effect the desired results.

It is apparent that many widely different embodiments of this invention may be made without departing from the spirit and scope thereof, and therefore it is not intended to be limited to the above description except as indicated in the appended claims.

What is claimed is:

1. The method of making a plurality of circuits interconnected at a plurality of discrete points, said method comprising the steps of placing on a base plate a first layer of thermoplastic material having a copper foil bonded thereto, etching an insulating path around a desired circuit configuration to provide an insulated space between the desired circuit configuration and the remaining copper foil, forming dimpled portions in said circuit configuration at said discrete points, and laminating succeeding layers of thermoplastic material and copper foil thereon, etching the foil and forming dimpled portions in a similar manner, simultaneously applying heat and a cutting force through said aligned dimpled portions to provide a hole therethrough and to melt out thermoplastic material in the immediate vicinity of the hole to expose for a connection these dimpled portions having holes therethrough, electroconductively sensitizing the walls of said hole and exposed dimpled conductive portions and thereafter electroplating said wall and conductive portions with a conductive material to provide a mechanical and electrical interconnection between said circuits at said discrete points.

2. The method of making a plurality of circuits interconnected at a plurality of discrete points, said method comprising the steps of bonding a first layer of thermoplastic material with a copper foil, etching an insulating path around a desired circuit configuration to provide an insulated space between the desired circuit configuration and the remaining copper foil, forming dimpled portions in said circuit configuration at said discrete points, and laminating succeeding layers of thermoplastic material and copper foil thereon, etching the foil and forming dimpled portions in a similar manner, simultaneously applying heat and a cutting force through said aligned dimpled portions to provide a hole therethrough and to melt out thermoplastic material in the immediate vicinity of the hole to expose for a connection these dimpled portions having holes therethrough, electroconductively sensitizing the wall of said hole and exposed dimpled conductive portions and thereafter electroplating wall and conductive portions with a conductive material to provide a mechanical and electrical interconnection between said circuits at said discrete points.

3. The method of making a plurality of circuits interconnected at a plurality of discrete points, said method comprising the steps of placing on a base plate a first layer of thermoplastic material having a copper foil bonded thereto, etching an insulating path around a desired circuit configuration to provide an insulated space between the desired circuit configuration and the remaining copper foil, and laminating succeeding layers of thermosplastic material and copper foil thereon, etching the foil and forming dimpled portions in a similar manner, simultaneously applying heat and a cutting force through said aligned portions to provide a hole therethrough and to melt out thermoplastic material in the immediate vicinity of the hole to expose for a connection these portions having holes therethrough, electroconductively sensitizing the wall of said hole and exposed conructive portions and thereafter electroplating said wall and conductive portions with a conductive material to provide a mechanical and electrical interconnection between said circuits at said discrete points.

4. The method of making a plurality of circuits interconnected at a plurality of discrete points, said method comprising the steps of placing on a base plate a first layer of thermoplastic material having a copper foil bonded thereto, etching a desired circuit thereon, forming dimpled portions in said circuit configuration at said discrete points, and laminating succeeding layers of thermoplastic material and copper foil thereon, etching the foil and forming dimpled portions in a similar manner, simultaneously applying heat and a cutting force through said aligned dimpled portions to provide a hole therethrough and to melt out thermoplastic material in the immediate vicinity of the hole to expose for a connection those dimpled portions having holes therethrough, electroconductively sensitizing the wall of said hole and exposed dimpled conductive portions and thereafter electroplating said wall and conductive portions with a conductive material to provide a mechanical and electrical interconnection between said circuits at said discrete points.

5. The method of making a plurality of circuits interconnected at a plurality of discrete points, said method comprising the steps of placing on a base plate a first layer of thermoplastic material having a copper foil bonded thereto, etching an insulating path around a desired circuit configuration to provide an insulated space between the desired circuit configuration and the remaining foil, forming dimpled portions in said circuit configuration at said discrete points, and laminating succeeding layers of thermoplastic material and copper foil thereon, etching the foil and forming dimpled portions in a similar manner, cutting a hole through the aligned dimpled circuit portions, electroconductively sensitizing said hole and dimpled conductive portions in contact therewith and thereafter electroplating said hole with a conductive material to provide a mechanical and electrical interconnection between said circuits at said discrete points.

References Cited by the Examiner

UNITED STATES PATENTS

| | | | |
|---|---|---|---|
| 2,502,291 | 3/50 | Taylor. | |
| 2,586,854 | 2/52 | Myers | 174—68.5 |
| 2,734,150 | 2/56 | Beck. | |
| 2,872,391 | 2/59 | Hansen et al. | |
| 2,876,393 | 3/59 | Tally et al. | 174—68.5 |
| 2,889,393 | 6/59 | Berger. | |
| 2,897,409 | 7/59 | Gitto. | |
| 2,907,925 | 10/59 | Parsons | 29—155.5 |
| 2,958,120 | 11/60 | Taylor | 29—155.5 |
| 2,990,310 | 6/61 | Chan | 29—155.57 |
| 3,037,265 | 6/62 | Kollmeier. | |
| 3,102,213 | 8/63 | Bedson et al. | 29—155.57 |

OTHER REFERENCES

"Selectacon Harness System" Engineering Bulletin #9, Tape Cable Corp., November 1958.

WHITMORE A. WILTZ, *Primary Examiner.*

JOHN F. CAMPBELL, *Examiner.*

UNITED STATES PATENT OFFICE
CERTIFICATE OF CORRECTION

Patent No. 3,201,851

August 24, 1965

Thomas H. Stearns

It is hereby certified that error appears in the above numbered patent requiring correction and that the said Letters Patent should read as corrected below.

Column 2, line 33, for "cap" read -- gap --.

Signed and sealed this 24th day of May 1966.

(SEAL)
Attest:

ERNEST W. SWIDER
Attesting Officer

EDWARD J. BRENNER
Commissioner of Patents